United States Patent [19] … [11] Patent Number: 4,835,017
Ishikawa et al. … [45] Date of Patent: May 30, 1989

[54] LIQUID COMPOSITION FOR FORMING SILICA-BASED COATING FILM

[75] Inventors: Tsutomu Ishikawa, Yokosuka; Muneo Nakayama, Tokyo; Akira Hashimoto, Yokohama; Toshihiro Nishimura, Kawasaki, all of Japan

[73] Assignee: Tokyo Ohka Kogyo Co., Ltd., Kawasaki, Japan

[21] Appl. No.: 194,248

[22] Filed: May 16, 1988

[30] Foreign Application Priority Data

May 29, 1987 [JP] Japan ................. 62-131480

[51] Int. Cl.$^4$ .............................................. B05D 3/02
[52] U.S. Cl. ................... 427/379; 106/287.1; 106/287.23; 427/387; 427/384
[58] Field of Search ............ 106/287.1, 287.23; 427/384, 379, 387

[56] References Cited

U.S. PATENT DOCUMENTS 4,247,436  1/1981  Baning et al. ................. 156/329 X
4,322,476  3/1982  Molari ............................ 428/447 X Primary Examiner—Michael Lusignan
Attorney, Agent, or Firm—Armstrong, Nikaido, Marmelstein, Kubovcik & Murray

[57] ABSTRACT

A liquid coating composition for forming a silica-based coating film on the surface of a substrate such as a semiconductor silicon wafer. A partial hydrolysis product of an alkoxy silane and an alkoxy or phenoxy compound of pentavalent antimony are dissolved in an organic solvent. As compared with a trivalent antimony compound used in the prior art, the pentavalent antimony compound as an additive is very effective in respect of the improvements in the uniformity and increased thickness of the silica-based coating film prepared from the coating composition as well as storage stability of the coating composition over time.

7 Claims, No Drawings

LIQUID COMPOSITION FOR FORMING SILICA-BASED COATING FILM

BACKGROUND OF THE INVENTION

The present invention relates to a liquid composition for forming a silica-based coating film or, more particularly, to a liquid composition having excellent storage stability and capable of giving a silica-based coating film having uniformity and a relatively large thickness. The invention also relates to a method for forming a silica-based coating film on the surface of various kinds of substrates such as semiconductor silicon wafers by using a liquid coating composition.

As is well known, it is widely practiced to provide a silica-based coating film to the surface of a substrate such as a semiconductor silicon wafer. The known methods for forming such a silica-based coating film are roughly classified into vaporphase deposition methods and coating methods, of which the former methods of vapor-phase deposition are generally preferred hitherto. Vapor-phase deposition, however, has several problems and disadvantages. For example, the method must be performed by using special apparatus with a limitation in respect of the maximum size of the substrate materials to be treated therein. The method is not suitable for the treatment of a large number of substrates with relatively low productivity in mass production. The method is less versatile than the coating method when the desired coating film should be formed of a mixture of organic and inorganic constituents. It is a trend in recent years, accordingly, that the vapor-phase deposition method is replaced with the more simple and convenient coating method, when possible.

A conventional coating liquid which is applied to the surface of a substrate to form a silica-based coating film is a dispersion of a finely divided powder of silica or glass in a suitable solvent containing a polymeric material dissolved therein as a vehicle. Such a coating liquid is practically not usable because of the poor stability of the dispersoid in the liquid medium readily causing settling therein and the silica-based coating film obtained therefrom is poor with respect to uniformity in thickness. With an object to overcome the above mentioned prob-lems, a proposal has been made in Japanese Patent Publications Nos. 52-16488 and 52-20825 to use a reaction product of a halogeno-silane compound with a carboxylic acid and an alcohol in place of the fine powder of silica. Although this method is naturally free from the problems of precipitation or non-uniformity of the coating film because the film-forming ingredient in the coating liquid is not in the form of a dispersion but in the form of a solution, different disadvantages are caused by the use of a halogeno-silane. The film-forming coating solution unavoidably contains a halogen compound such as hydrogen halide as a by-product of the reaction so that the substrate coated with the coating solution followed by a heat treatment may be subject to corrosion due to the halogen compound. In addition, pin holes and cracks are sometimes formed in a silica-based coating film having a relatively large thickness of, for example, 15 to 40 $\mu$m formed by using such a coating solution. Therefore, the coating solution of this type is also practically not usable.

In order to solve the above mentioned problem in respect of corrosion of substrates, Japanese Patent Publication No. 57-39658 has proposed a silica-based film-forming coating solution in which the film-forming constituent is a reaction product of a lower alkoxy silane compound with a lower carboxylic acid and an alcohol in the presence of an organic acid-type reaction promotor. It is also taught the silica-based film-forming coating solution may be admixed with an antimony alcoholate compound as a vitrifying agent with an object of increasing the thickness and uniformity of the coating film formed therefrom. The antimony-containing silica-based film-forming coating solution is indeed capable of giving a coating film having outstandingly high uniformity and large thickness as compared with conventional coating solutions without the problem of corrosion in the substrate coated therewith but the coating solution has a defect of extremely low storage stability and readily gels during storage.

As is described above, none of the silica-based film-forming coating compositions of the prior art is satisfactory from the standpoint of practical use so that it is eagerly desired to develop a coating solution having high storage stability and capable of giving a uniform silica-based coating film with sufficiently large thickness.

SUMMARY OF THE INVENTION

The present invention accordingly has an object to provide a novel and improved liquid coating composition for forming a silica-based coating film on a substrate surface free from the above described problems and disadvantages of the prior art coating compositions. The invention also has an object to provide a method for forming a silica-based coating film having a sufficiently large thickness and high uniformity by use of the novel and improved liquid coating composition.

Thus, the liquid coating composition for forming a silica-based coating film on a substrate surface provided by the present invention comprises, in admixture:

(a) an organic solvent;

(b) a partial hydrolysis product of an alkoxy silane compound dissolved in the organic solvent; and (c) an alcoholate compound of pentavalent antimony represented by the general formula Sb(OR)$_5$, in which R is an alkyl group having 1 to 4 carbon atoms or an aryl group having 6 to 9 carbon atoms, dissolved in the organic solvent.

Further, the method of the present invention for forming a silica-based coating film on the surface of a substrate comprises the steps of:

(A) coating the substrate surface with a liquid coating composition comprising:

(a) an organic solvent;

(b) a partial hydrolysis product of an alkoxy silane compound dissolved in the organic solvent; and (c) an alcoholate compound of pentavalent antimony represented by the general formula Sb(OR)$_5$, in which R is an alkyl group having 1 to 4 carbon atoms or an aryl group having 6 to 9 carbon atoms, dissolved in the organic solvent;

(B) drying the liquid coating composition on the substrate surface; and (C) heating the thus dried coating composition on the substrate surface at a temperature in the range from 150° C. to 900° C.

DETAILED DESCRIPTION OF THE PREFERRED EMBODIMENTS

The most characteristic feature of the above described present invention is the admixture of an alcoholate compound of pentavalent antimony with a solution of a partial hydrolysis product of an alkoxy silane. This unique formulation of the liquid coating composition has been established on the basis of an unexpected discovery that a pentavalent antimony compound is more stable than a corresponding tervalent antimony compound in an organic solution containing a partial hydrolysis product of an alkoxy silane compound so that a liquid composition for forming a silica-based coating film is obtained by the addition of a pentavalent antimony compound free from the disadvantages in the prior art coating compositions.

The principal ingredient in the inventive liquid composition for forming a silica-based coating film is a partial hydrolysis product of an alkoxy silane compound which is represented by the general formula $(R^1O)_{4-n}SiR^2_n$, in which $R^1$ is a group selected from alkyl groups having 1 to 4 carbon atoms, allyl group, aryl groups having 6 to 9 carbon atoms, vinyl group, glycidyloxymethyl group, glycidyloxyethyl group, glycidyloxypropyl group, acryloxymethyl group, acryloxyethyl group, acryloxypropyl group, methacryloxymethyl group, methacryloxyethyl group and methacryloxypropyl group, $R^2$ is a group selected from alkyl groups having 1 to 4 carbon atoms, alkoxy groups, allyl group, aryl groups having 6 to 9 carbon atoms, vinyl group, glycidyloxymethyl group, glycidyloxyethyl group, glycidyloxypropyl group, acryloxymethyl group, acryloxyethyl group, acryloxypropyl group, methacryloxymethyl group, methacryloxyethyl group and methacryloxypropyl group, and the subscript n is zero, 1, 2 or 3.

Examples of suitable alkoxy silane compounds include tetramethoxy silane, tetraethoxy silane, tetrapropoxy silane, tetrabutoxy silane, monomethyl trimethoxy silane, dimethyl dimethoxy silane, monoethyl triethoxy silane, diethyl diethoxy silane, diphenyl dimethoxy silane, monomethyl triethoxy silane, monoethyl tributoxy silane, diethyl dibutoxy silane, dimethoxy dibutoxy silane, vinyl methyl dimethoxy silane, vinyl ethyl diethoxy silane, vinyl trimethoxy silane, vinyl triethoxy silane, vinyl tributoxy silane, 3-acryloxypropyl trimethoxy silane, 3-acryloxypropyl triethoxy silane, 2-methacryloxyethyl trimethoxy silane, 2-methacryloxyethyl triethoxy silane, 2-glycidyloxyethyl trimethoxy silane, 2-glycidyloxyethyl triethoxy silane, 3-glycidyloxypropyl trimethoxy silane, 3-glycidyloxypropyl triethoxy silane and the like.

The antimony compound as the essential additive in the liquid coating composition of the invention is an alcoholate compound of pentavalent antimony represented by the general formula $Sb(OR)_5$, in which R is an alkyl group having 1 to 4 carbon atoms or an aryl group having 6 to 9 carbon atoms.

Examples of suitable pentavalent antimony alcoholates include pentamethoxy antimony, pentaethoxy antimony, pentapropoxy antimony, pentabutoxy antimony, pentaphenoxy antimony, pentatolyloxy antimony and the like. These antimony compounds can be used either singly or as a combination of two kinds or more according to need.

Known antimony alcoholate compounds include those of tervalent antimony and pentavalent antimony. The alcoholate compounds of tervalent antimony generally have lower stability than those of pentavalent antimony so that a coating solution prepared by use of a tervalent antimony alcoholate is not practically usable because such a solution is sometimes subject to the formation of a gelled material therein. The reason for the higher stability of a pentavalent antimony alcoholate than the corresponding tervalent antimony alcoholate is presumably that the pentavalent antimony alcoholate is a compound of antimony of the highest atomic valency and the atom of pentavalent antimony has a closed-shell structure.

As is mentioned above, the principal ingredient in the inventive liquid composition is a partial hydrolysis product of an alkoxy silane compound. The partial hydrolysis product of an alkoxy silane is prepared by adding water to a solution of the alkoxy silane in an organic solvent because addition of an undiluted alkoxy silane to water may cause rapid proceeding of the hydrolysis reaction followed by polycondensation of the hydrolysis product to form an insoluble gelled material so that no uniform coating solution can be obtained.

Examples of suitable organic solvents include alcohols, e.g., methyl alcohol, ethyl alcohol, propyl alcohol and butyl alcohol, $\beta$-diketones, e.g., acetyl acetone, ethyl acetoacetate, benzoyl acetone and diethyl malonate, ketones, e.g., acetone, methyl ethyl ketone and methyl isobutyl ketone, polyhydric alcohols and ethers and esters thereof, e.g., ethylene glycol, glycerin, diethylene glycol, ethylene glycol monomethyl ether, ethylene glycol monoethyl ether, ethylene glycol monobutyl ether and propylene glycol as well as alkyl esters thereof, and the like. These organic solvents can be used either singly or as a mixture of two kinds or more according to need. Preferably, the organic solvent should be an alcohol as such or an alcohol admixed with a $\beta$-diketone from the standpoint of exhibiting good solubilizing power for the alkoxy antimony compound or phenoxy antimony compound as an essential ingredient in the inventive liquid composition.

The partial hydrolysis product of an alkoxy silane compound, which is obtained by adding water to a solution of an alkoxy silane compound in the above mentioned organic solvent, should preferably have 1 to 3 hydroxy groups in a molecule or, in particular, should be a hydroxy silane compound having 1.5 to 3.0 hydroxy groups on an average per molecule.

The above mentioned hydroxy silane compounds in the partial hydrolysis product of an alkoxy silane can be identified by subjecting the hydrolysis product to a liquid chromatographic analysis and calculating the amount of the respective species of the hydroxy silane compounds from the area of the peak for each of the hydroxy silane compounds so as to find the average number of the hydroxy groups per molecule.

Although no definite formulation of the reaction mixture for the hydrolysis reaction can be given relative to the amounts of the alkoxy silane compound, water and inorganic acid, such as hydrochloric, sulfuric and nitric acids, added as a catalyst according to need because any partial hydrolysis product can be used provided that the hydrolysis product is composed of the hydroxy silane compounds mentioned above, a satisfactory partial hydrolysis product of the alkoxy silane can be obtained by using 1 to 3 moles or, preferably, 1.5 to 3.0 moles of water per mole of the alkoxy silane compound and by conducting the hydrolysis reaction in the presence of a catalyst mentioned above. Actual formulation is of course not limited to the above.

The solution containing the hydrox silanes obtained by the partial hydrolysis of the alkoxy silane compound in the above described manner is, if necessary, diluted by adding the above exemplified organic solvent so as to have a concentration of 1 to 20% by weight calculated as silica $SiO_2$ followed by filtration through a filter having a pore diameter of 0.2 to 10 μm in order to remove insoluble materials such as dust particles before the solution is used as a liquid coating composition for forming a silica-based coating film on a substrate surface. The above mentioned concentration of the solution as calculated for the content of silica is represented approximately by the content of the non-volatile matter determined by evaporating an accurately weighed amount of the hydroxy silane-containing solution in a volume of 3 to 5 ml to dryness by heating at 140° C. for 3 hours.

Another essential ingredient in the inventive liquid composition is an alkoxylate or phenoxylate of pentavalent antimony. The amount of this antimony compound in the inventive liquid composition is preferably in the range of 10 to 80% by weight based on the content of silica as defined above in the solution prepared by the partial hydrolysis of an alkoxy silane compound. When the amount of the antimony compound is too small in the solution, the solution is not practically usable because no uniform and sufficiently thick coating film can be formed thereof. When the amount of the antimony compound is too large, on the other hand, the hydroxy silane-containing solution may have somewhat decreased stability in storage. It is a convenient way of the preparation of the inventive liquid composition that a necessary amount of the antimony compound is first dissolved in an organic solution which is preferably an alcohol or a mixture mainly composed of an alcohol to give a solution and the solution is added to the solution containing the partial hydrolysis product of the alkoxy silane.

The hydroxy silane-containing liquid composition of the invention with admixture of the pentavalent antimony compound prepared in the above described manner is applied to the surface of various substrate materials such as semiconductor silicon, metals, glass and the like by a suitable coating method such as a spinner method, dipping method, spraying method, roll-coating method, printing method, brush-coating method and the like followed by drying. Thereafter, the coating film on the substrate surface is subjected to a heat treatment at a temperature in the range of from 150° C. to 900° C. to give a uniform silica-based coating film free from pin holes and cracks. When the temperature of the heat treatment is too low, no uniform coating film can be obtained. When the temperature of the heat treatment is too high, the atoms of antimony contained in the coating film may cause diffusion into the substrate to undesirably affect the properties of the substrate. The temperature of the heat treatment should be adequately selected depending on the heat resistance of the substrate material and should be as high as possible provided no adverse influences are caused on the properties of the substrate. When the substrate is made of aluminum, for example, the temperature of the heat treatment should not exceed 500° C. or, preferably, should be in the range from 400° C. to 500° C.

If desired, the liquid composition of the present invention can be admixed with a compound containing chlorine atoms in an amount not exceeding 5000 ppm as chlorine as a trapping agent of alkali metals which have detrimental influences in the manufacture of semiconductor devices. The amount of such a chlorine-containing compound should not exceed 5000 ppm because of the remarkable corrosion caused thereby in the coating equipment such as spinners.

In the following, the liquid coating composition of the invention is described in more detail by way of examples.

EXAMPLE 1

A mixture composed of 153 g (0.74 mole) of tetraethoxy silane, 26 g (1.44 moles) of water and 300 g of n-butyl alcohol with addition of 0.1 ml of concentrated hydrochloric acid was agitated at room temperature for 7 days to effect partial hydrolysis of the tetraethoxy silane. The degree of hydrolysis of the tetraethoxy silane was about 50% and the thus obtained hydroxy silane-containing solution had a concentration of 15% by weight calculated as silica.

Thereafter, 142.9 g of the thus obtained solution was admixed with 6.8 g of a 50% by weight solution of pentaethoxy antimony in ethyl alcohol to give a liquid coating composition. A semiconductor silicon wafer of 3 inches diameter was coated with this coating solution taking 20 seconds on a spinner rotating at 3000 rpm. The silicon wafer coated with the solution was subjected to a heat treatment at 600° C. for 10 minutes to form a coating film having a thickness of 30 μm which was highly uniform and free from pin holes and cracks. The coating solution was quite stable in storage and no gelled material was formed therein even after one month or longer of storage at room temperature.

EXAMPLE 2

A mixture composed of 200 g (0.84 mole) of dibutoxy dimethoxy silane, 30 g (1.66 moles) of water and 200 g of ethyl alcohol with addition of 0.1 ml of concentrated hydrochloric acid was agitated at room temperature for 7 days to effect partial hydrolysis of the alkoxy silane. The degree of hydrolysis of the alkoxy silane was about 50% and the thus obtained hydroxy silane-containing solution had a concentration of 18% by weight calculated as silica. This solution was diluted by adding ethyl alcohol to have a concentration of 10% by weight calculated as silica.

A 71.2 g portion of the diluted solution was admixed with 6.8 g of a 50% by weight solution of pentabutoxy antimony in butyl alcohol to give a coating solution. A semiconductor silicon wafer of 3 inches diameter was coated with this coating solution and subjected to a heat treatment under substantially the same conditions as in Example 1 except that the temperature of the heat treatment was 500° C. to give a coating film having a thickness of 20 μm, which was highly uniform and free from pin holes and cracks. The coating solution was quite stable in storage and no gelled material was formed therein even after one month or longer of storage at room temperature.

EXAMPLE 3

A mixture composed of 154 g (0.74 mole) of tetraethoxy silane, 40 g (2.21 moles) of water and 560 g of ethyl alcohol with addition of 2 ml of concentrated hydrochloric acid was agitated at room temperature for 7 days to effect partial hydrolysis of the tetraethoxy silane. The degree of hydrolysis of the alkoxy silane was about 75% and the thus obtained hydroxy silane-containing solution had a concentration of 12% by weight calculated as silica.

This solution was diluted by adding ethyl alcohol to have a concentration of 10% by weight calculated as silica.

A 75.0 g portion of the diluted solution was admixed with 7.0 g of a 50% by weight solution of pentabutoxy antimony in butyl alcohol to give a coating solution.

A semiconductor silicon wafer of 3 inches diameter was coated with this coating solution taking 5 seconds on a spinner rotating at 1000 rpm and then subjected to a heat treatment at 800° C. for 10 minutes to form a coating film having a thickness of 35 μm, which was highly uniform and free from pin holes and cracks. The coating solution was quite stable in storage and no gelled material was formed therein even after one month or longer of storage at room temperature.

EXAMPLE 4

A mixture composed of 153 g (0.74 mole) of tetraethoxy silane, 19.2 g (1.06 moles) of water and 200 g of butyl alcohol with addition of 0.1 ml of concentrated hydrochloric acid was agitated at room temperature for 7 days to effect partial hydrolysis of the alkoxy silane. The degree of hydrolysis of the alkoxy silane in the thus prepared hdroxy silane-containing solution was about 38%.

The above obtained solution was diluted by adding butyl alcohol to have a concentration of 6.2% by weight calculated as silica and a 168.2 g portion of the diluted solution was admixed with 10.5 g of a 50% solution of pentabutoxy antimony in butyl alcohol to give a coating solution. A semiconductor silicon wafer of 3 inches diameter provided with a vapor-deposited aluminum layer on the surface was coated with this coating solution taking 20 seconds on a spinner rotating at 3000 rpm and subjected to a heat treatment at 400° C. for 20 minutes to give a coating film having a thickness of 5 μm, which was highly uniform and free from pin holes and cracks. The coating solution was quite stable in storage and no gelled material was formed therein even after one month or longer of storage at room temperature.

EXAMPLE 5

A mixture composed of 153 g (0.58 mole) of tetrapropoxy silane, 26.5 g (1.47 moles) of water and 200 g of n-propyl alcohol with addition of 0.4 ml of concentrated hydrochloric acid was agitated for 7 days at room temperature to effect partial hydrolysis of the alkoxy silane. The degree of hydrolysis of the alkoxy silane was about 50% in the thus obtained hydroxy silane-containing solution of which the concentration was 12% by weight calculated as silica.

This solution was admixed with 20 g of a 50% solution of pentaphenoxy antimony in propyl alcohol to give a coating solution. A semiconductor silicon wafer was coated with this coating solution and subjected to a heat treatment in substantially the same manner as in Example 1 to give coating film having a thickness of 30 μm, which was highly uniform and free from pin holes and cracks. The coating solution was quite stable in storage and no gelled material was formed therein even after one month or longer of storage at room temperature.

COMPARATIVE EXAMPLE 1

A coating solution was prepared in just the same manner as in Example 1 except that the pentaethoxy antimony was replaced with 6.8 g of a 50% by weight solution of triethoxy antimony in ethyl alcohol. This coating solution was less stable than that of Example 1 and a gelled material was formed therein during storage at room temperature within 7 days.

As is described above, the liquid coating composition of the invention can be used for conveniently forming a smooth and uniform continuous silica-based coating film having a thickness of 0.05 to 50 μm and free from pin holes and cracks. Accordingly, even a substrate having a surface with roughness or level difference can be imparted with a smooth and level surface by coating with the inventive coating solution so that quite satisfactory insulating layers can be formed by using the solution in multi-layered surface wirings of electronic devices. Moreover, the addition of an alkoxy or phenoxy compound of pentavalent antimony is effective not only to ensure high uniformity and a large thickness of the coating film but also to greatly improve the storage stability of the solution.

What is claimed is:

1. A liquid coating composition for forming a silica-based coating film on a substrate surface which comprises, in admixture:
   (a) an organic solvent;
   (b) a partial hydrolysis product of an alkoxy silane compound dissolved in the organic solvent; and
   (c) an alcoholate compound of pentavalent antimony represented by the general formula $Sb(OR)_5$, in which R is an alkyl group having 1 to 4 carbon atoms or an aryl group having 6 to 9 carbon atoms, dissolved in the organic solvent wherein effective amounts of (a), (b) and (c) are employed.

2. The liquid coating composition for forming a silica-based coating film as claimed in claim 1 wherein the organic solvent is selected from the group consisting of alcohols, β-diketones, ketones, polyhydric alcohols, ethers of polyhydric alcohols and esters of polyhydric alcohols.

3. The liquid coating composition for forming a silica-based coating film as claimed in claim 2 wherein the organic solvent is an alcohol or a mixture of an alcohol and a β-diketone.

4. The liquid coating composition for forming a silica-based coating film as claimed in claim 1 wherein the partial hydrolysis product of an alkoxy silane compound is a mixture of hydroxy silane compounds of which the number of hydroxy groups is in the range from 1 to 3 per molecule on an average.

5. The liquid coating composition for forming a silica-based coating film as claimed in claim 1 wherein the concentration of the partial hydrolysis product of an alkoxy silane compound is in the range of from 1 to 20% by weight calculated as silica.

6. The liquid coating composition for forming a silica-based coating film as claimed in claim 1 wherein the amount of the alcoholate compound of pentavalent antimony is in the range of from 10 to 80% by weight based on the amount of the partial hydrolysis product of the alkoxy silane compound calculated as silica.

7. A method for forming a silica-based coating film on the surface of a substrate which comprises the steps of:
   (A) coating the substrate surface with a liquid coating composition comprising:
   (a) an organic solvent;
   (b) a partial hydrolysis product of an alkoxy silane compound dissolved in the organic solvent; and
   (c) an alcoholate compound of pentavalent antimony represented by the general formula $Sb(OR)_5$, in which R is an alkyl group having 1 to 4 carbon atoms or an aryl group having 6 to 9 carbon atoms, dissolved in the organic solvent wherein effective amounts of (a), (b) and (c) are employed;

(B) drying the liquid coating composition on the substrate surface; and
(C) heating the thus dried coating composition on the substrate surface at a temperature in the range from 150° to 900° C.

* * * * *